United States Patent
Hsieh et al.

(10) Patent No.: US 11,296,173 B2
(45) Date of Patent: Apr. 5, 2022

(54) DUAL-SIDED DISPLAYS

(71) Applicant: Hewlett-Packard Development Company, L.P., Spring, TX (US)

(72) Inventors: Hsing-Hung Hsieh, Taipei (TW); Ann Alejandro Villegas, Houston, TX (US); Chi Hao Chang, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/481,464

(22) PCT Filed: Dec. 8, 2017

(86) PCT No.: PCT/US2017/065295
§ 371 (c)(1),
(2) Date: Jul. 27, 2019

(87) PCT Pub. No.: WO2019/112601
PCT Pub. Date: Jun. 13, 2019

(65) Prior Publication Data
US 2021/0280656 A1   Sep. 9, 2021

(51) Int. Cl.
*H01L 27/32* (2006.01)
*H01L 51/56* (2006.01)

(52) U.S. Cl.
CPC .......... *H01L 27/3267* (2013.01); *H01L 51/56* (2013.01)

(58) Field of Classification Search
CPC ... H01L 27/3267; H01L 51/56; G06F 1/1616; G06F 1/1647; G06F 1/1692; G06F 3/1423; H04M 1/0214; G09G 2330/026; G09G 2330/021; G09G 2340/0492
See application file for complete search history.

(56) References Cited

U.S. PATENT DOCUMENTS

| | | | |
|---|---|---|---|
| 9,361,851 B1 | 6/2016 | Basehore et al. | |
| 9,606,723 B2* | 3/2017 | Selim | G06F 3/1423 |
| 11,038,003 B2* | 6/2021 | Park | H01L 51/0097 |
| 2003/0227254 A1 | 12/2003 | Terumoto | |
| 2004/0245531 A1* | 12/2004 | Fuii | H01L 27/156 257/88 |
| 2005/0093767 A1 | 5/2005 | Lu et al. | |
| 2006/0061563 A1 | 3/2006 | Fleck | |
| 2011/0199361 A1* | 8/2011 | Shin | G06F 1/1616 345/211 |
| 2013/0271378 A1 | 10/2013 | Hulford | |
| 2015/0286359 A1 | 10/2015 | Oakley et al. | |

(Continued)

OTHER PUBLICATIONS

Asus Taichi: a Laptop with a Double-sided Display, Jun. 4, 2012, http://www.pocket-lint.com/news/115736-asus-taichi-two-screen-ultrabook-computex.

*Primary Examiner* — Kyoung Lee
*Assistant Examiner* — Christina A Sylvia
(74) *Attorney, Agent, or Firm* — Tong, Rea, Bentley & Kim LLC

(57) ABSTRACT

In example implementations, a display is provided. The display includes a first portion and a second portion. The first portion includes a first plurality of light emitting diodes (LEDs) that emit light in a first direction. The second portion includes a combination of the first plurality of LEDs that emit light in the first direction and a second plurality of LEDs that emit light in a second direction that is opposite the first direction to form a dual-sided display.

7 Claims, 4 Drawing Sheets

(56) References Cited

U.S. PATENT DOCUMENTS

2016/0027391 A1* 1/2016 Gibson .............. G02F 1/13475 345/690
2017/0117342 A1 4/2017 Kwon

* cited by examiner

DUAL-SIDED DISPLAYS

BACKGROUND

Displays can be used in various types of electronic devices. For example, displays can be used to provide information or graphics as part of a laptop computer, desktop computer, a tablet device, and the like. The display can be controlled by a graphics processor to generate images associated with a program or computer implemented instructions. The display may be directed towards a user to provide the information or graphics generated by the display to the user.

Various different technologies can be used to manufacture the display. The display can be a cathode ray tube (CRT) display, a thin-film-transistor (TFT) liquid crystal display (LCD), and the like.

DETAILED DESCRIPTION

Examples described herein provide a dual-sided display and methods for fabricating the same. As discussed above, a display can be used in various different electronic devices and can be fabricated from different materials. Current displays are generally one sided and emit light or images in a single direction (e.g., a direction facing a user).

In some instances some users may desire to have information displayed even when the display is closed (e.g., when a display is part of a clam-shell laptop or electronic device). Some solutions deploy two separate or independent displays. For example, a first display may face the user when the device is open and a second display may be on a backside of the first display to display information when the electronic device is closed. However, using two separate displays can add costs to building the electronic device, or take up valuable space causing the device to be thicker in an era when devices are getting thinner and thinner.

Examples described herein provide a display that includes a portion that is a dual-sided display. For example, a first portion of the display may be a single-sided display (e.g., emits light or images towards a user). A second portion of the display may be a dual-sided display that can emit light or images in a first direction towards a user and in a second direction that is opposite the first direction, away from the user. The first portion and the second portion of the display can be fabricated on a single substrate. Thus, a single display can include a portion that performs as a dual-sided display.

Figure 1:
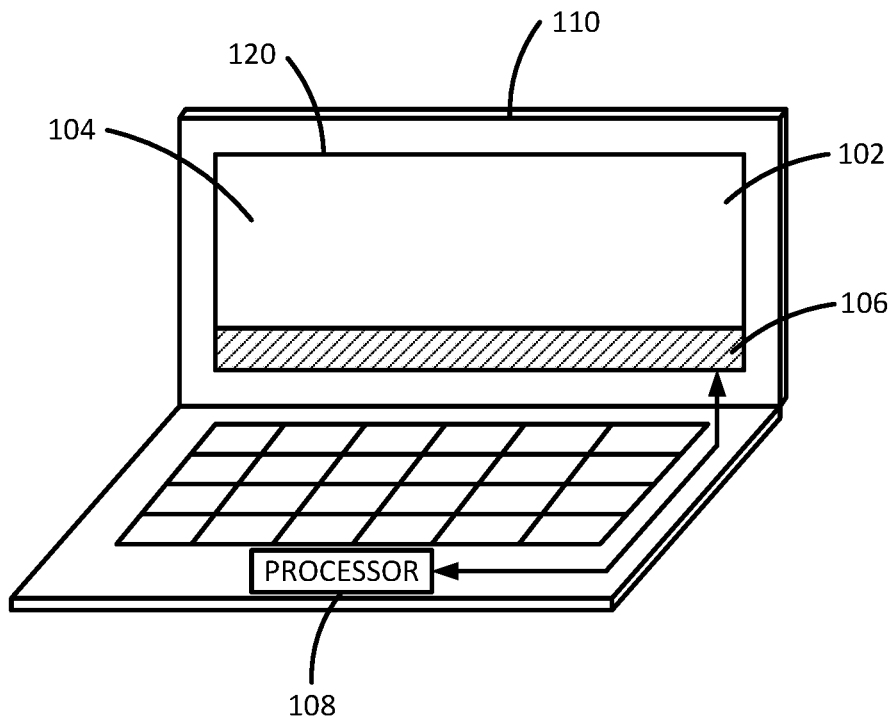
FIG. 1 is a block diagram of an example of an apparatus of the present disclosure in an open position.

FIG. 1 illustrates an apparatus 100 when the apparatus 100 is in an open position. The apparatus 100 may be a laptop computer or any type of electronic device that has clam-shell enclosure. In one example, the apparatus 100 may include a display 102 that is enclosed by a housing 110. The housing 110 may be any type of metallic, plastic, or glass material used for enclosures of electronic devices.

In one example, a first side of the housing 110 may have an opening 120 that is sized to be approximately equal to the dimensions of the display 102. For example, the dimensions may include a width and a length of the display 102.

In one example, the display 102 may include a first portion 104 and a second portion 106. The first portion 104 may include a non-dual-sided display where light sources of the first portion 104 each emits light towards the user. The second portion 106 may be a dual-sided display where light sources of the second portion 106 each emits light towards the user and away from the user. For example, the second portion 106 may have some light sources that emit light or images in a first direction towards a user and other light sources that emit light or images in a second direction (that is opposite or 180 degrees from the first direction) away from the user.

As a result, the second portion 106 of the display 102 may generate images in combination with images generated by the first portion 104 of the display to create an overall image that is seen on the display 102. In another example, the second portion 106 may display images that are separate from the images generated by the first portion 104. For example, the second portion 106 may generate a stock ticker while a user is executing a different application in the first portion 104.

In one example, a processor 108 may be in communication with the display 102. The processor 108 may execute instructions stored in memory to control operations of the display 102 overall, and/or the first portion 104 and the second portion 106. For example, the processor 108 may control operation of the first portion 104 and the second portion 106 as a single overall display or control operation of the first portion 104 and the second portion 106 as separate displays.

In one example, the second portion 106 may be smaller in dimensions than the first portion 104. For example, the dimensions of the second portion 106 may be less than half of the dimensions of the display 102. In another example, the dimensions of the second portion 106 may be a third of the dimensions of the display 102. In another example, the second portion 106 may be large enough to display a few lines of text.

Figure 2:
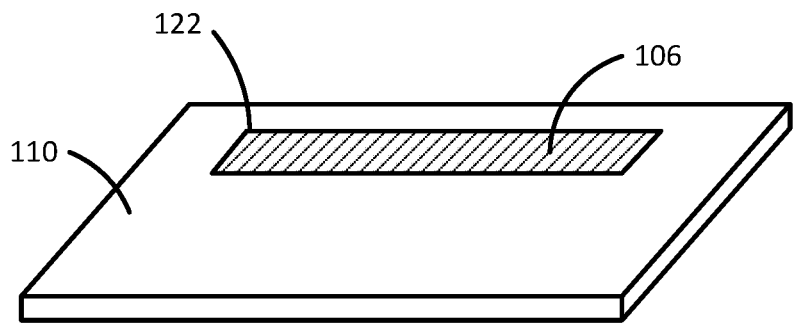
FIG. 2 is a block diagram of an example of an apparatus of the present disclosure in a closed position.

FIG. 2 illustrates a block diagram of the example apparatus 100 in a closed position. As can be seen in the closed position, the housing 110 may include an opening 122 on a back side. The opening 122 may be sized to be approximately equal to the dimensions of the second portion 106 of the display 102.

As noted above, the second portion 106 of the display 102 may be a dual-sided display. As a result, the second portion 106 of the display 102 may generate images that can be seen through the opening 122 even when the apparatus 100 is in a closed position. Notably, the second portion 106 of the display 102 is not a separate display or a second display. Rather, the second portion 106 is part of a single display 102 that is also seen when the apparatus 100 is in the open position as illustrated in FIG. 1.

The operation of the second portion 106 of the display 102 when the apparatus 100 is closed can be controlled by the processor 108. For example, the second portion 106 of the display 102 can display notifications, updates, video, graphical images, and the like, while the apparatus 100 is in a closed position.

In addition, the second portion 106 of the display 102 may generate two different images on two different sides simultaneously. For example, when the apparatus 100 is opened, the second portion 106 facing the user may generate an image that is part of a larger overall image that is displayed by a combination of the first portion 104 and the second portion 106 of the display 102. At the same time, the second portion 106 may generate a different image that can be seen through the opening 122 on a back side of the housing 110.

For example, the second portion 106 may display a title of a movie that is being watched through the opening 122. As a result, a parent sitting across from a child may monitor what content a child is watching on the display 102 without being able to see the entire display 102 by simply reading the second portion 106 of the display through the opening 122.

In another example, a user may exchange messages sitting across from another person by displaying text in the second portion 106 through the opening 122. A user may be viewing or executing an application that is on the display 102 using the first portion 104 and the second portion 106, while simultaneously sending messages using the second portion 106 through the opening 122 on the back side of the housing 110.

In another example, the second portion 106 may be used as part of a study aid or a quiz game. For example, the second portion 106 may display a question through the opening 122 for a person sitting across the apparatus 100 and facing the backside of the housing 110. A user facing the display 102 may have an answer and/or a list of questions to choose from on the display 102 using the first portion 104 and the second portion 106.

Figure 3:
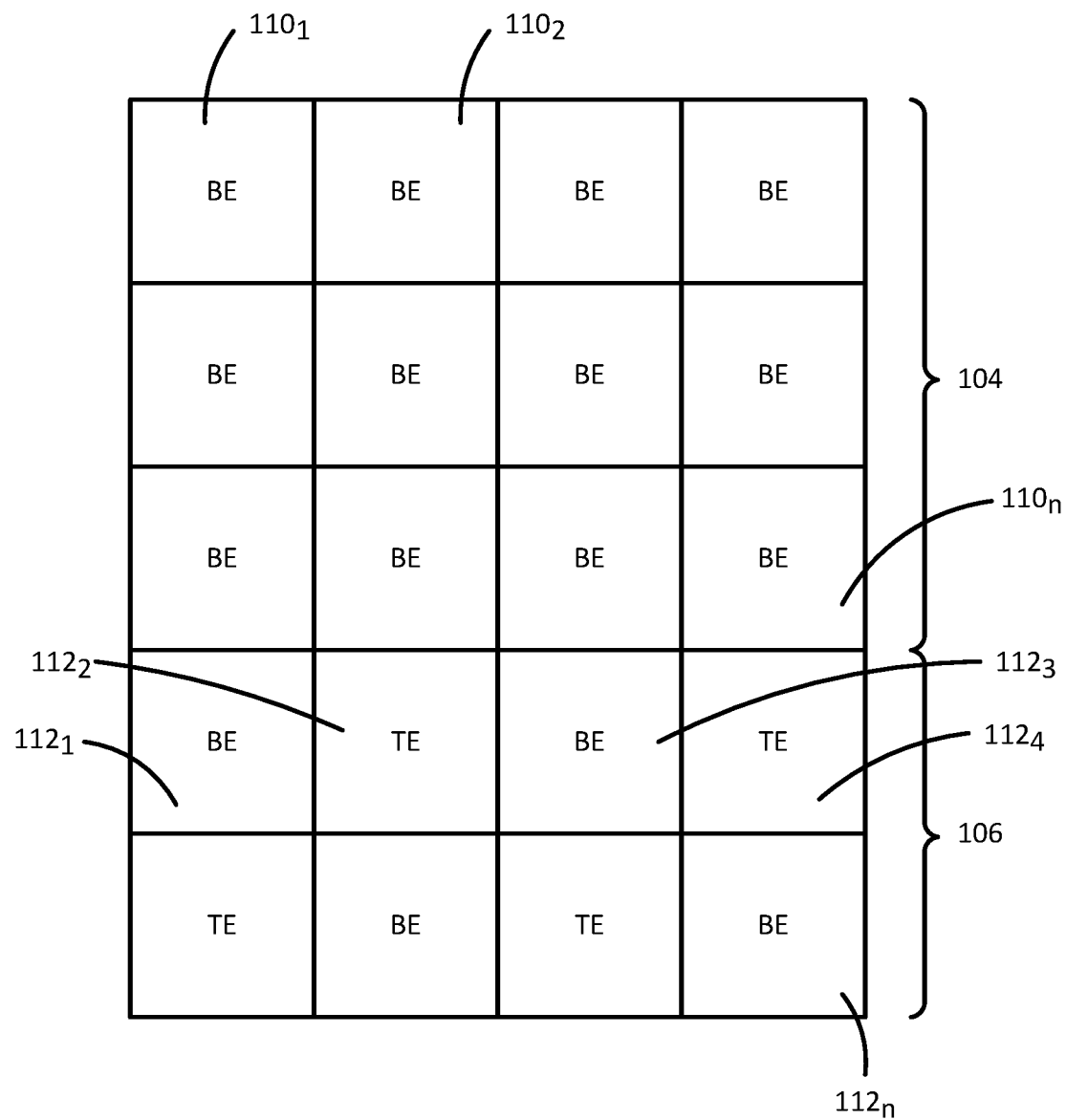
FIG. 3 illustrates an example arrangement of light emitting diodes in a display of the present disclosure.

FIG. 3 illustrates an example arrangement of light sources in the display 102. In one example, the display 102 may comprise the first portion 104 and the second portion 106 of LEDs that are fabricated from a single substrate. For example, the first portion 104 may include a single type of LEDs. For example, the LEDs $110_1$ to $110_n$ (hereinafter referred to individually as an LED 110 or collectively as LEDs 110) may be a bottom emission (BE) LED. The LEDs 110 may emit light in a first direction (e.g., towards a user facing the display 102).

In one example, the second portion 106 may include LEDs $112_1$ to $112_n$ (hereinafter referred to individually as an LED 112 or collectively as LEDs 112). The LEDs 112 may include two different types of LEDs. For example, the LEDs 112 may include a mix of BE LEDs and top emission (TE) LEDs. The BE LEDs may emit light in the same direction as the LEDS 110 (e.g., in the first direction towards the user facing the display 102). The TE LEDs may emit light in a second direction that is opposite the first direction (e.g., away from the user towards the opening 122 on the backside of the housing 110). The combination of the BE LEDs and TE LEDs in the second portion 106 may form a dual-sided display. Both the LEDs 110 and the LEDs 112 may be organic LEDs (OLEDs).

In one example, the second portion 106 may include an alternating pattern of the two different types of LEDs 112. For example, LED $112_1$ may be a BE LED, LED $112_2$ may be a TE LED, LED $112_3$ may be a BE LED, LED $112_4$ may be a TE LED, and so forth. The next row of the second portion 106 may begin with a TE LED and alternate between BE LEDs and TE LEDs. In other words, the alternating pattern may be similar to a checkerboard pattern.

Although an alternating pattern of two different types of LEDs is described above, it should be noted that other patterns of different types of LEDs could also be deployed for the second portion 106. For example, alternating rows of different types of LEDs may be deployed, a sequence of two BE LEDs, two TE LEDs, two BE LEDs, and so forth, may be deployed, and the like. In other words, any type of pattern may be deployed that allows a first type of LEDs to display an image as part of the display 102 with the first portion 104 and a second type of LEDs to display an image through an opening 122 on a backside of the housing 110.

Although FIG. 3 illustrates an example where the first portion 104 includes BE LEDs and the second portion comprises an alternating pattern of BE LEDs and TE LEDs, it should be note that the type of LEDs may be flipped. For example, the LEDs 110 may be TE LEDs and the LEDs 112 may include TE LEDs and BE LEDs. For example, the LED $112_1$ may be a TE LED, the LED $112_2$ may be a BE LED, and so forth.

Figure 4:
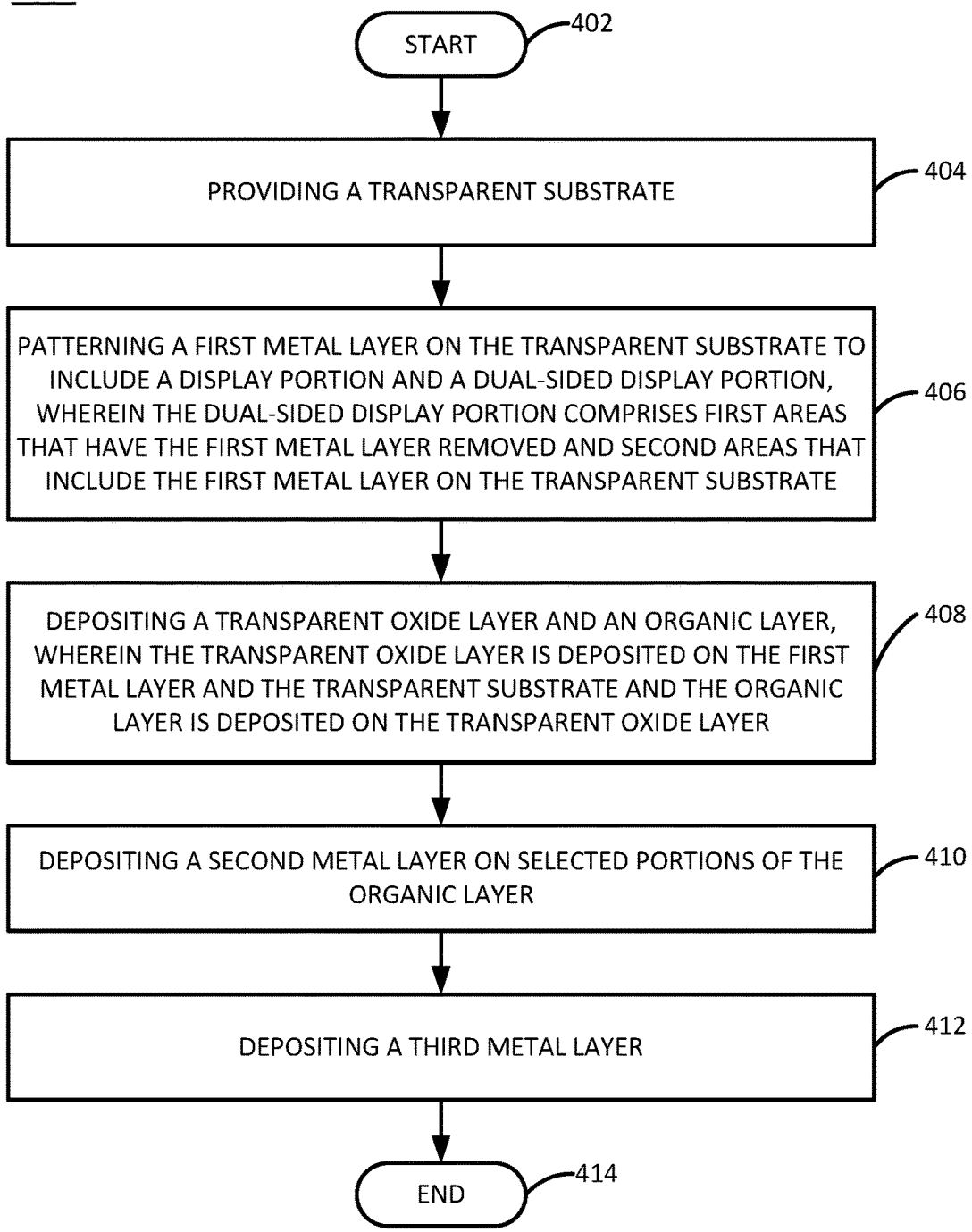
FIG. 4 is a flow chart of an example method for fabricating a display having a first portion and a second portion that is a dual-sided display.

FIG. 4 illustrates a flow diagram of an example method 400 for fabricating a display having a first portion and a second portion that is a dual-sided display. In one example, the method 400 may be performed by one or more tools in a fabrication plant including deposition tools, etching tools, lithography and patterning tools, and the like. In one example, FIG. 4 may be read in conjunction with a process flow 500 illustrated in FIG. 5. As a result, FIG. 4 may refer to portions of FIG. 5 when describing the blocks of FIG. 4.

Figure 5:
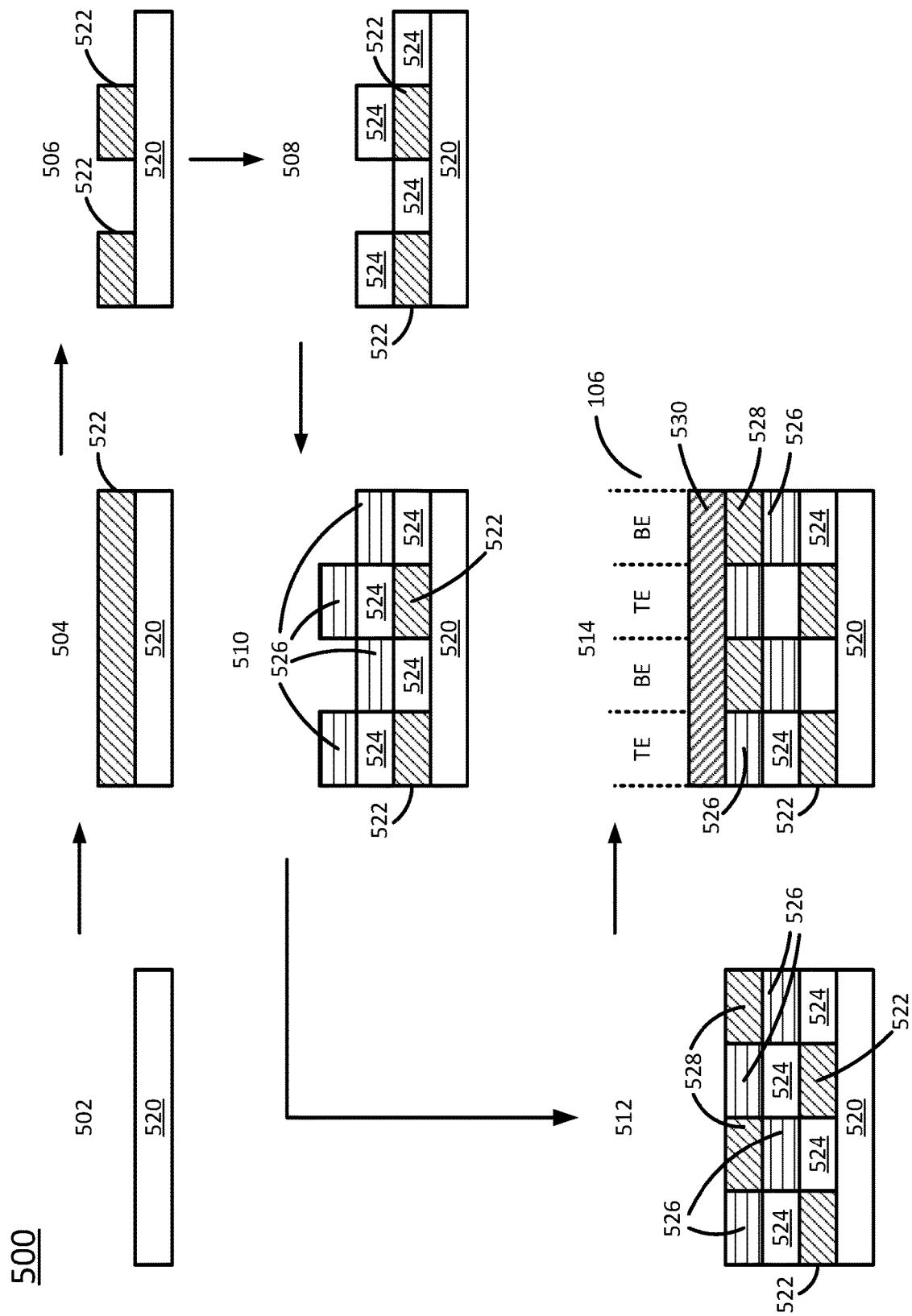
FIG. 5 is a process flow diagram of an example method for fabricating a display having a first portion and a second portion that is a dual-sided display.

It should be noted that FIG. 5 illustrates a cross-sectional view of a process flow for the dual-sided display portion. The single sided display portion may be similarly fabricated using the methods for the similar type of LED. For example, if the single sided display portion comprises BE LEDs, the processing described below for the BE LEDs may be used. Alternatively, if the single sided display portion comprises TE LEDs, the processing described below for the TE LEDS may be used. FIG. 5 illustrates an example where the first portion includes BE LEDs and the second portion includes a combination of BE LEDs and TE LEDs.

At block 402, the method 400 begins. At block 404, the method 400 provides a transparent substrate. For example, the transparent substrate may be a glass based substrate, a plastic, and the like. The transparent substrate may be flexible or rigid. FIG. 5 illustrates an example substrate 520 at block 502. In one example, the substrate 520 is shown as a flat surface for ease of explanation. However, it should be noted that the substrate 520 may not be flat, but may have pixel structures in the substrate 520 similar to thin film transistors (TFTs). In other words, the LEDs formed by the process flow 500 may not be laterally continuous even though they are shown to be laterally continuous in FIG. 5 for ease of explanation.

At block 406, the method 400 patterns a first metal layer on the transparent substrate to include a display portion and a dual-sided display portion, wherein the dual-sided display portion comprises first areas that have the first metal layer removed and second areas that include the first metal layer on the transparent substrate. For example, at block 504, a first metal layer 522 may be deposited onto the substrate 520. Any type of deposition process may be used for depositing the first metal layer 522, and any of the materials deposited in the subsequent steps described below may be used for depositing the first metal layer 522. Examples of the deposition processes may include vapor deposition, spin-coating, and the like. The first metal layer 522 may be any type of opaque metal or a layer of metal that is thick enough such that the first metal layer 522 is opaque. For example, a thick layer of the first metal layer 522 may be approximately 50-150 nanometers (nm).

At block 506 of the process flow 500, the areas that form the BE LEDs may be etched to remove the first metal layer 522. For example, lithography, patterning, and etching processes may be used to selectively remove the first metal layer 522 from the entire area of the substrate 520 that will be the first portion 104, described above, and the areas of the substrate 520 that are BE LEDs in the second portion.

At block 408, the method 400 deposits a transparent oxide layer and an organic layer, wherein the transparent oxide layer is deposited on the first metal layer and the transparent substrate and the organic layer is deposited on top of the transparent oxide layer. For example, at block 508 in FIG. 5, a transparent oxide layer 524 may be deposited or grown over the entire substrate 520. The transparent oxide layer 524 may include a material such as indium tin oxide (ITO). The transparent oxide layer 524 may be deposited using deposition, photolithography, and etching, similar to how the first metal layer 522 is added.

As a result, the areas that will form the BE LEDs may have a layer of the transparent oxide layer 524 on the substrate 520 and the areas that will form the TE LEDs may have a layer of the transparent oxide layer 524 on the first metal layer 522. In one example, the transparent oxide layer 524 may be approximately 10-50 nm.

At block 510 in FIG. 5, an organic layer 526 may be deposited on all areas of the substrate 520. As a result, the organic layer 526 may be deposited on top of the transparent oxide layer 524 of both the BE LEDs and TE LEDs. The organic layer 526 may be deposited via a shadow mask technique. The shadow mask technique may automatically form a desired pattern without the use of photolithography and/or etching steps to remove unwanted portions of the organic layer 526. Examples of materials that can be used as the organic layer 526 may be any type of organic material used for OLEDs, including polyfluorenes, various vinyl carbazoles, phosphorescent metal complexes, and the like. In one example, the organic layer 526 may be approximately 30-100 nm.

At block 410, the method 400 deposits a second metal layer on selected portions of the organic layer. For example, at block 512 in FIG. 5, a second metal layer 528 may be deposited on the substrate 520. The selected portions of the organic layer 526 may be those portions of the organic layer 526 that will eventually form the BE LEDs. The second metal layer 528 may be added using the shadow masking technique similar to how the organic layer 526 is deposited. Thus, the second metal layer 528 is deposited into the desired areas without the use of photolithography and/or etching steps to remove unwanted portions of the second metal layer 528. The second metal layer 528 may be the same metal that was used for the first metal layer 522. The second metal layer 528 may be an opaque metal or a layer of metal that is thick enough to appear opaque. In one example, the second metal layer 528 may be approximately 50-200 nm.

As noted above and illustrated in FIG. 3, the patterning may comprise an alternating pattern of the first areas and the second areas in the dual-sided display portion. For example, the alternating pattern may be a checkerboard pattern.

At block 412, the method 400 deposits a third metal layer. At block 514, a third metal layer 530 may be deposited over the entire substrate 520. The third metal layer 530 may be a semi-transparent metal such as aluminum, indium tin oxides, and the like. In one example, the third metal layer 530 may be any type of metal that is deposited to a thickness that allows the third metal layer 530 to be semi-transparent. In one example, the third metal layer may be approximately 10-30 nm.

As shown in FIG. 5, the final processed substrate may include an alternating pattern of BE LEDs and TE LEDs. Also, as discussed above, a top view of the substrate 520 would show a first portion that represents a single sided display having a single type of LED (e.g., all BE LEDs, or all TE LEDs) and a second portion that represents the dual-sided display having both types of LEDs (e.g., the BE LEDs and TE LEDs). Thus, the display having the single sided display portion and the dual-sided display portion may be fabricated from a single substrate 520. At block 414, the method 400 ends.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A display, comprising:
a first portion comprising a first plurality of light emitting diodes (LEDs) that emit light in a first direction;
a second portion comprising a combination of the first plurality of LEDs that emit light in the first direction and a second plurality of LEDs that emit light in a second direction that is opposite the first direction to form a dual-sided display;
a housing enclosing the display, the housing comprising:
a first side of the housing comprising an opening that is sized to be approximately equal to dimensions of the display; and
a second side of the housing comprising an opening that is sized to be approximately equal to dimensions of the second portion;
a processor in communication with the display to control operations of the first portion and the second portion of the display.

2. The display of claim 1, wherein the first portion and the second portion are fabricated on a single substrate.

3. The display of claim 1, wherein the first plurality of LEDs comprises bottom emission organic LEDs.

4. The display of claim 1, wherein the second plurality of LEDs comprise top emission organic LEDs.

5. The display of claim 1, wherein the combination of the first plurality of LEDs and the second plurality of LEDs are arranged in an alternating pattern.

6. The display of claim 5, wherein the alternating pattern comprises a checkerboard pattern.

7. The display of claim 1, wherein the second portion comprises a combination of bottom emission organic LEDs and top emission organic LEDs arranged in an alternating pattern.

* * * * *